United States Patent
Lu et al.

(10) Patent No.: US 7,090,967 B2
(45) Date of Patent: Aug. 15, 2006

(54) PATTERN TRANSFER IN DEVICE FABRICATION

(75) Inventors: Zhijian Lu, Plano, TX (US); Chieh-Yu Lin, Hopewell Junction, NY (US)

(73) Assignee: Infineon Technologies AG, Munich (DE)

( * ) Notice: Subject to any disclaimer, the term of this patent is extended or adjusted under 35 U.S.C. 154(b) by 228 days.

(21) Appl. No.: 10/248,232

(22) Filed: Dec. 30, 2002

(65) Prior Publication Data

US 2004/0126705 A1 Jul. 1, 2004

(51) Int. Cl.
*G03F 7/26* (2006.01)

(52) U.S. Cl. ........................... 430/324; 430/330
(58) Field of Classification Search ............... 430/322, 430/324, 325, 330, 311
See application file for complete search history.

(56) References Cited

U.S. PATENT DOCUMENTS

| 5,780,187 A | 7/1998 | Pierrat ........................... 430/5 |
| 6,197,455 B1 | 3/2001 | Yedur et al. .................... 430/5 |
| 6,225,031 B1 | 5/2001 | Appelt et al. ............... 430/315 |
| 6,753,117 B1 | 6/2004 | Lu ................................ 430/30 |
| 2002/0168594 A1 | 11/2002 | Lin et al. |
| 2003/0027080 A1 * | 2/2003 | Lu ............................. 430/313 |
| 2004/0043332 A1 * | 3/2004 | Yamamoto et al. ......... 430/311 |

* cited by examiner

*Primary Examiner*—Kathleen Duda
(74) *Attorney, Agent, or Firm*—Slater & Matsil, L.L.P.

(57) ABSTRACT

A method of transferring a pattern onto a substrate, in the fabrication of ICs, is disclosed. The substrate is coated with a photoresist layer, wherein the photoresist layer is selectively exposed and developed, producing sidewalls that exhibit roughness. The roughness is smoothened out by coating the photoresist layer with a coating layer.

18 Claims, 4 Drawing Sheets

PATTERN TRANSFER IN DEVICE FABRICATION

BACKGROUND OF INVENTION

The fabrication of integrated circuits (ICs) involves the formation of features that make up devices, such as transistors and capacitors, and the interconnection of such devices to achieve a desired electrical function. Since the cost of fabricating ICs is inversely related to the number of ICs per wafer, there is a continued demand to produce a greater number of ICs per wafer. This requires features to be formed smaller and smaller to reduce manufacturing costs.

Features are formed using photolithographic techniques, which includes depositing a resist over a device layer which is to be patterned. The resist is exposed with radiation or light through a mask. For a positive type resist, the exposed portions of the resist layer are removed during development, leaving a patterned resist layer to serve as a mask for an etch to transfer the pattern of the mask to the device layer.

In conventional lithographic techniques, line edge roughness (LER) occurs in the patterned resist layer. LER refers to the sidewalls of the resist mask being not smooth. Causes for LER include, for example, poor image contrast, non-uniform distribution of resist components, or insufficient acid diffusion during exposure. LER can result in uneven or irregular transfer of pattern onto the substrate. As feature size becomes smaller, the irregular pattern transfer can cause various device issues, particularly with high density dynamic random access memory (DRAM) ICs. For example, irregular pattern transfer can cause variations in gate threshold voltage ($V_T$), leakage, and degradation of retention time, thereby adversely impacting device performance, reliability, and manufacturing yields.

From the foregoing discussion, it is desirable to improve the transfer of a pattern onto a substrate during manufacturing process.

SUMMARY OF INVENTION

The present invention relates to the fabrication of ICs. More particularly, the invention relates to the transfer of patterns on a substrate for forming features during IC fabrication. The substrate is coated with a photoresist layer and selectively exposed. The photoresist layer is then developed to selectively remove portions thereof. During the development process, sidewalls of the photoresist layer exhibit roughness. In accordance with the invention, the roughness is smoothed out by coating the photoresist layer with a coating layer. In one embodiment, the coating layer is cross-linked with the photoresist layer.

DETAILED DESCRIPTION

Figure 1:
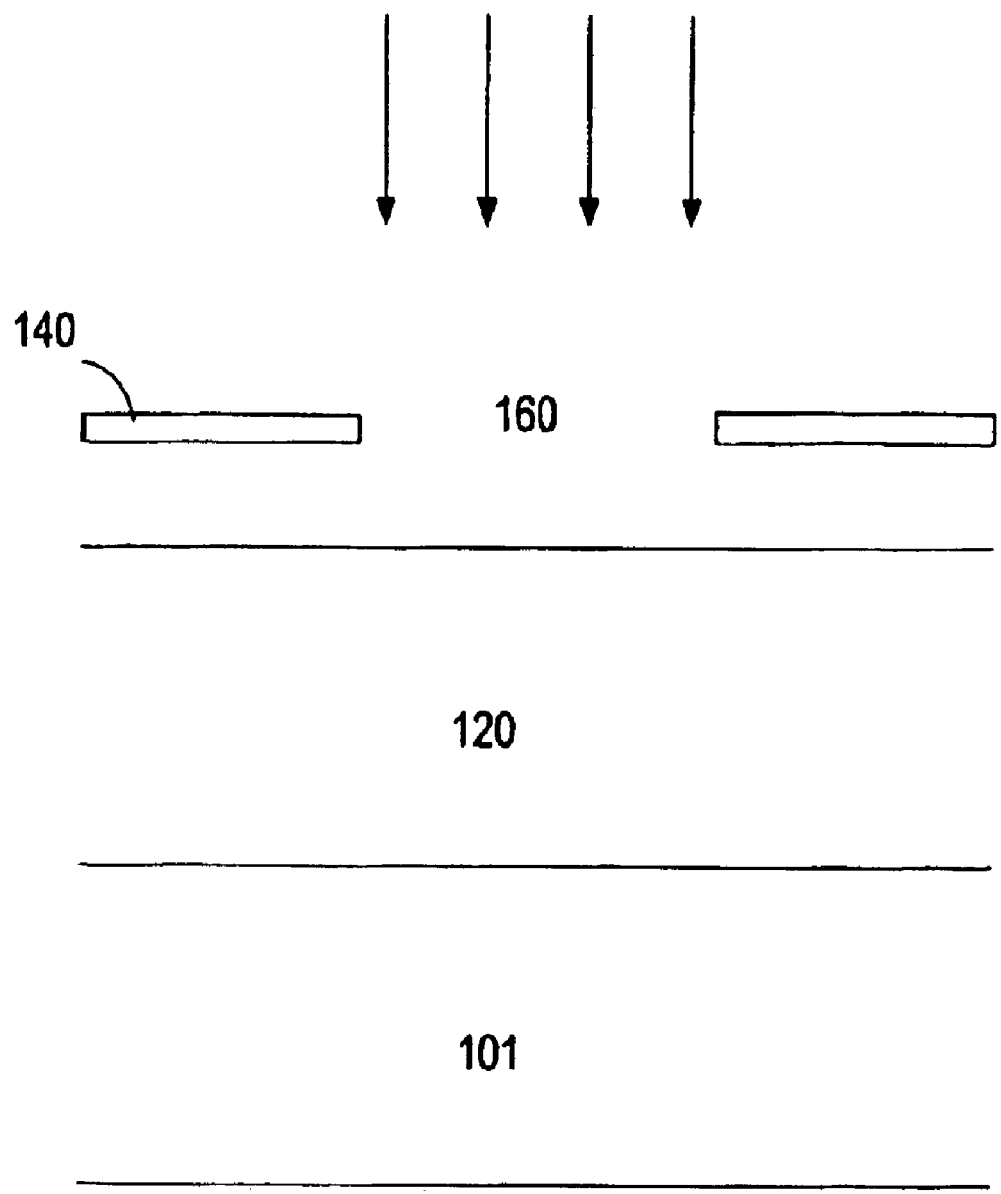
FIGS. 1–4 show a process for transferring a pattern onto a substrate in accordance with one embodiment of the invention.

FIGS. 1–4 show a process for patterning a device layer during fabrication of an IC. Various types of ICs, such as memory, processors or DSPs, can be formed. As shown, a substrate 101 is provided. The substrate, in one embodiment, is a semiconductor substrate, such as silicon. The substrate can be prepared to include one or more device layers, depending on the stage of processing. For example, device layers can include dielectric materials (e.g., silicon dioxide or silicon nitride), conductive materials (copper, tungsten, or aluminum), or semiconductive materials (polysilicon).

A photoresist layer 120 is deposited on the surface of the substrate. The thickness of the photoresist layer is, for example, about 0.15 to 1.5 μm. Various types of photoresist can be used. In one embodiment, the photoresist is sensitive to radiation at or below 248 nm. Photoresists that are sensitive to radiation at other wavelengths are also useful. The photoresist comprises components, such as photosensitive compounds, which are dissolved in a solvent. Typically, the resist is deposited onto the surface of the substrate by spin-on techniques. Other techniques can also be used. A post-application soft bake is performed, for example, at a temperature of 80–140 degrees Celsius for about 1–30 minutes to remove the solvent. The surface of the resist layer is then selectively exposed to radiation from a radiation source. In one embodiment, a mask 140 containing the desired pattern is provided above the substrate. Radiation selectively illuminates the surface of the resist layer through mask opening 160 or openings.

Figure 2:
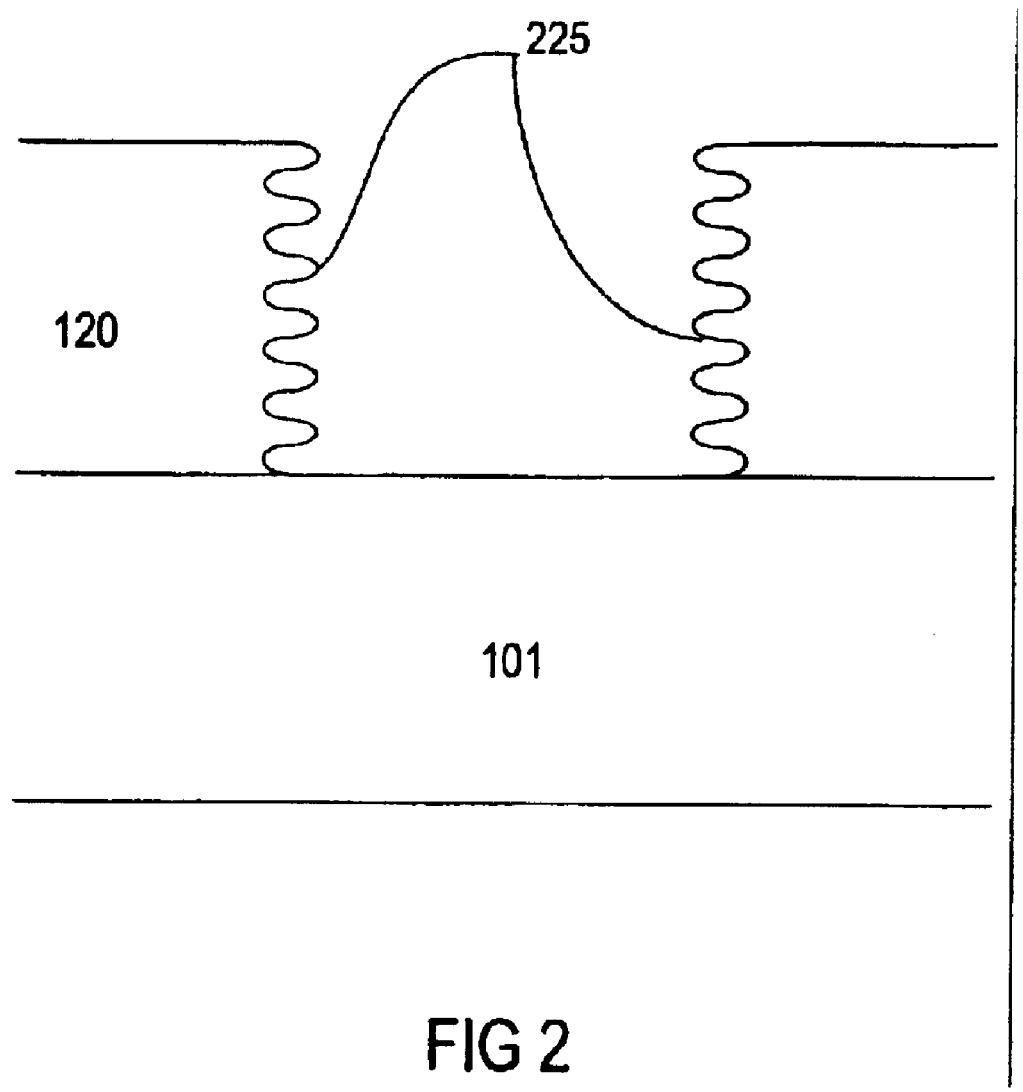

Referring to FIG. 2, the resist is developed after exposure. The development process includes, for example, applying the developer onto the substrate, puddle development and rinsing the substrate. Removal of the exposed portions of the resist layer creates an etch mask with the desired pattern. However, the sidewalls of the resist can exhibit roughness 225, which adversely impacts the transfer of the desired pattern onto the substrate.

Figure 3:
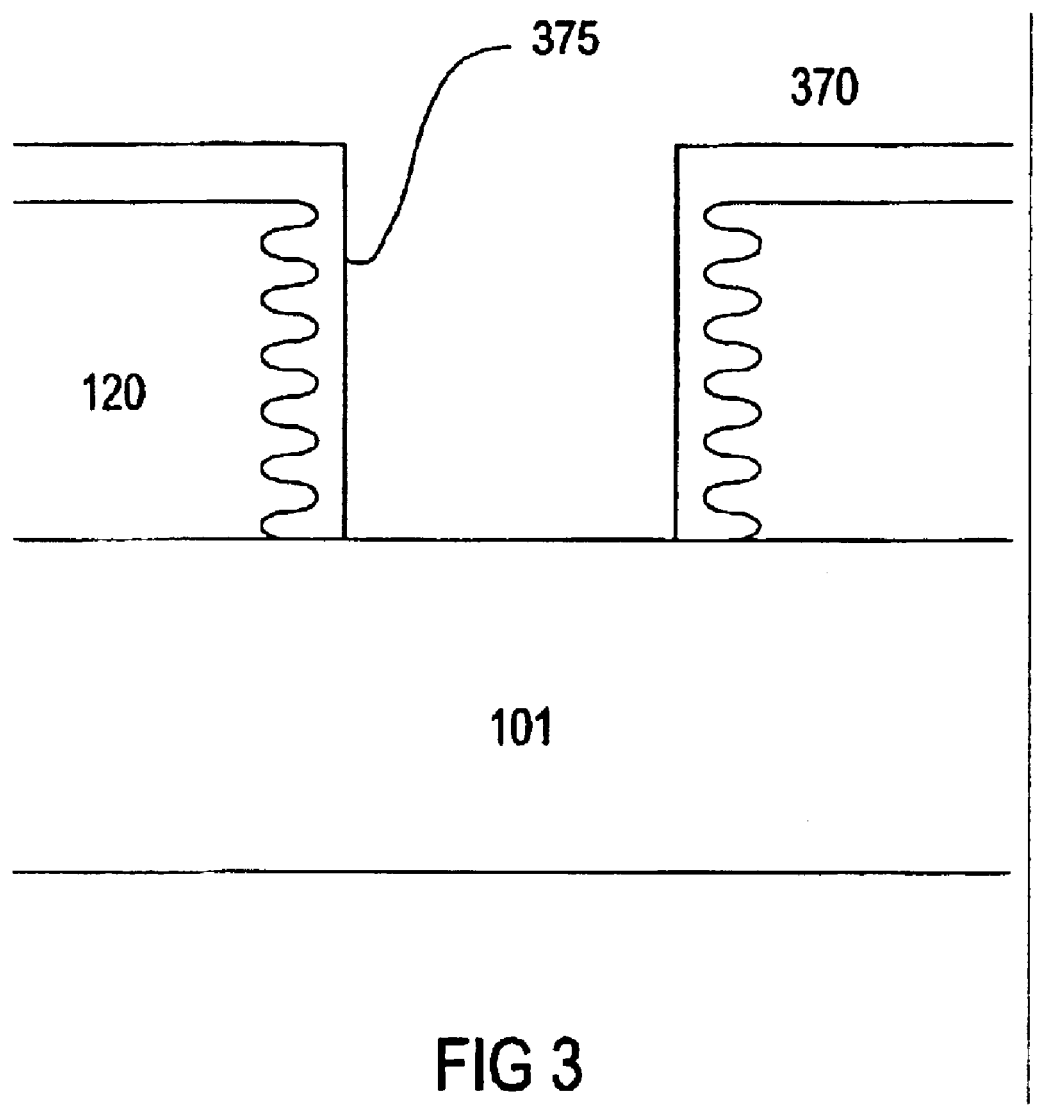

In accordance with one embodiment of the invention, a coating layer 375 is deposited onto the resist mask, as shown in FIG. 3. The coating layer smoothens out the roughness on the sidewalls of the resist layer. In one embodiment, the coating layer comprises a polymer solution which can be spun-on. In a preferred embodiment, the coating layer comprises a polymer solution which can be cross-linked with the resist layer. Various polymer solutions, such as commercially available Clariant AZ® R200 coating, can be used. For example, the coating layer may comprise imidazole derivatives for cross-linking with a polymer resist such as poly hydroxystyrene (PHS). After the coating layer is deposited, the solvent of the coating layer is removed. Removal of the solvents can be achieved by, for example, baking the substrate at about 85 degrees Celsius for about 70 seconds.

Figure 4:
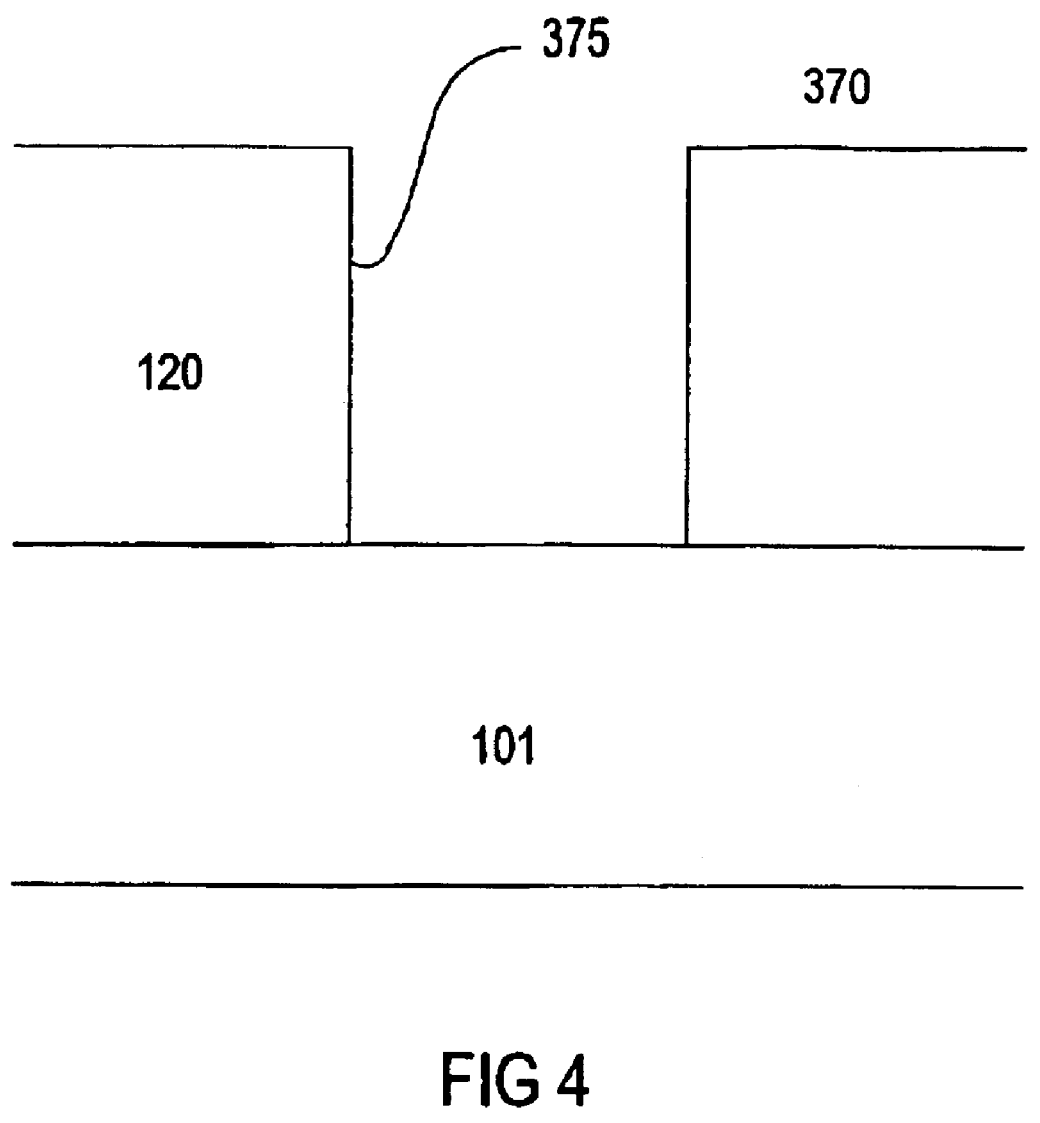

Referring to FIG. 4, the coating layer is cross-linked with the resist layer. In one embodiment, cross-linking is achieved by baking the substrate at a temperature of about 100 degrees Celsius for about 60 seconds. After cross-linking, the coating layer and resist layer bond to form a single integrated mask with smooth sidewalls 375. This advantageously improves resolution of the pattern transfer process, which improves device performance, functionality, and yields. The mask is then developed and rinsed, using for example, the AZ® R2 developer manufactured by Clariant, to remove the non-crosslinked coating material.

The substrate is etched to create the desired features. The features, for example, correspond to gate conductors, damascene trenches for conductive lines, or conductive lines, depending on the stage of processing. The remaining resist is stripped after the pattern is transferred to the substrate. The fabrication process continues to form the IC, such as a memory IC or other types of logic ICs.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A method of pattern transfer in the fabrication of ICs, comprising:
   providing a substrate;
   coating the substrate with a photoresist layer;
   selectively exposing the photoresist layer;
   developing the photoresist layer to selectively remove portions thereof, wherein sidewalls of the photoresist layer exhibit roughness; and
   coating the photoresist layer with a coating layer to smoothen out the roughness.

2. The method of claim 1 wherein the coating layer comprises a polymer solution.

3. The method of claim 2 wherein the step of coating the photoresist layer with a coating layer comprises spin-on techniques.

4. The method of claim 1 wherein the step of selectively exposing the photoresist layer comprises selectively exposing the photoresist layer through a mask.

5. The method of claim 4 wherein the coating layer comprises a polymer solution.

6. The method of claim 5 wherein the step of coating the photoresist layer with a coating layer comprises spin-on techniques.

7. The method of claim 5 wherein the polymer solution comprises imidazole derivatives.

8. A method of pattern transfer in the fabrication of ICs, comprising:
   providing a substrate; coating the substrate with a photoresist layer;
   selectively exposing the photoresist layer;
   developing the photoresist layer to selectively remove portions thereof, wherein sidewalls of the photoresist layer exhibit roughness;
   coating the photoresist layer with a coating layer to smoothen out the roughness; and cross-linking the coating layer with the photoresist layer.

9. The method of claim 8 wherein the coating layer comprises a polymer solution.

10. The method of claim 9 wherein the step of coating the photoresist layer with a coating layer comprises spin-on techniques.

11. The method of claim 10 wherein the step of cross-linking the coating layer with the photoresist layer comprises baking the substrate.

12. The method of claim 11 wherein the step of cross-linking the coating layer with the photoresist layer comprises baking the substrate at about 100 degrees Celsius for about 60 seconds.

13. The method of claim 8 wherein the step of selectively exposing the photoresist layer comprises selectively exposing the photoresist layer through a mask.

14. The method of claim 13 wherein the coating layer comprises a polymer solution.

15. The method of claim 14 wherein the step of coating the photoresist layer with a coating layer comprises spin-on techniques.

16. The method of claim 13 wherein the polymer solution comprises imidazole derivatives.

17. The method of claim 9 wherein the step of cross-linking the coating layer with the photoresist layer comprises baking the substrate.

18. The method of claim 17 wherein the step of cross-linking the coating layer with the photoresist layer comprises baking the substrate at about 100 degrees Celsius for about 60 seconds.

* * * * *